Figure 1:
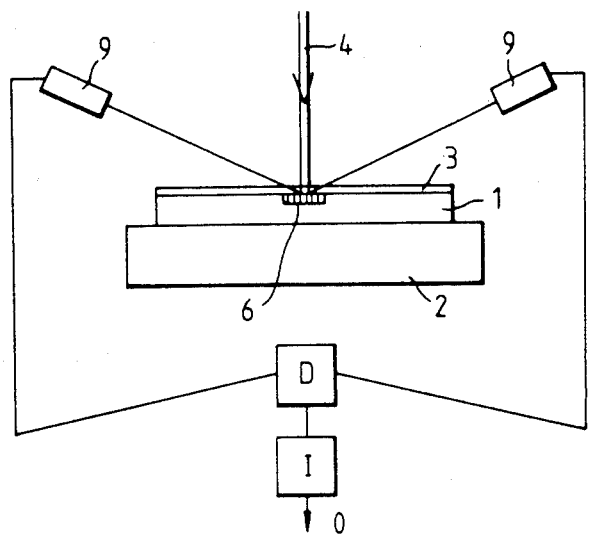

United States Patent [19]
King et al.

[11] Patent Number: 4,503,334
[45] Date of Patent: Mar. 5, 1985

[54] METHOD OF USING AN ELECTRON BEAM

[75] Inventors: Hewson N. G. King, Redhill; James P. Beasley, Tadworth, both of England

[73] Assignee: U.S. Philips Corporation, New York, N.Y.

[21] Appl. No.: 435,021

[22] Filed: Oct. 18, 1982

[30] Foreign Application Priority Data

Nov. 2, 1981 [GB] United Kingdom ............... 8132927

[51] Int. Cl.³ ..................... G01N 21/00; G01N 23/00
[52] U.S. Cl. ................................................ 250/491.1
[58] Field of Search ............... 250/492.2, 491.1, 398, 250/396 R; 219/121 EB, 121 EM

[56] References Cited

U.S. PATENT DOCUMENTS 4,145,597  3/1979  Yasuda ........................ 250/396 R

OTHER PUBLICATIONS

"Computer-Controlled Scanning Electron Microscope System for High Resolution Microelectronic Pattern Fabrication", Ozdemir et al., *IEEE Trans. on Electron Dev.*, vol. 19, No. 5, May 1972, pp. 624–628.
"Producing Registration Marks for Electron Beam Exp.", Hatzakis et al., *IBM Tech. Bull.*, vol. 12, No. 10, Mar. 1970, p. 1721.
"Optimization of Alignment Marks and their Electron Signals in a Semiconductor Process", Friedrich et al., *J. Electrochem. Soc.*, vol. 124, No. 4, pp. 627–629.

*Primary Examiner*—Bruce C. Anderson
*Attorney, Agent, or Firm*—Paul R. Miller

[57] ABSTRACT

When an electron beam is used to effect a process at two adjacent surface areas of a target, such as a semiconductor wafer coated with an electron sensitive resist, various alignment errors can occur including wafer distortion. The provision of a reference marker, for example a square-etched depression, at the surface of the target between the adjacent surface areas enables detection of any misalignment. Thus, after effecting the process at one of the areas, an electron beam having substantially the same size and shape as the reference marker is directed toward the predetermined position of the reference marker. Back-scattered electrons are then detected to give a signal representative of any deviation between the actual position and the predetermined position of the reference marker so that the electron beam can be correctly aligned before carrying out the process at the second of the two surface areas. For increased accuracy of alignment, an array of reference markers may be provided between the two adjacent areas.

21 Claims, 6 Drawing Figures

METHOD OF USING AN ELECTRON BEAM

This invention relates to a method of using an electron beam to effect sequentially a process at two adjacent surface areas of a target.

An important application of electron beam technology is in the manufacture of semiconductor devices. In particular, a so-called electron beam pattern generator can be used to direct an electron beam towards a target in the form of a semiconductor substrate coated with an electron sensitive resist. By computer control of the beam a predetermined pattern can be drawn in the resist. The exposed parts (or, in the case of a negative resist, the unexposed parts) of the resist are then removed selectively using an appropriate chemical. The remaining parts of the resist form on the surface of the semiconductor substrate a masking layer which can be used subsequently in the processing of the semiconductor wafer.

Unfortunately, the area (sometimes called the deflection field) which can be scanned by the electron beam is somewhat restricted because of the occurrence of electron optical aberrations which increase markedly as the electron beam deviates more and more from the optical axis. This presents a problem when large areas of resist are to be exposed. However, in the manufacture of semiconductor devices such as integrated circuits, it is usually the case that the same, relatively small pattern has to be drawn repeatedly across a large semiconductor substrate. Because of this, the beam can be used to draw one pattern at a first area of the substrate before moving the substrate to introduce a new area of the substrate to the electron beam. Thus the same (or a different) pattern can be drawn at this new area without the need for the beam to have an unduly large deflection field. In fact, as long as the substrate can be moved in two transverse directions the whole of a resist layer present on a semiconductor substrate having, for example, a diameter of 4 inches can be exposed by sequentially drawing the same pattern at relatively small areas, typically 3 mm square, across the surface of the substrate. Not surprisingly, this technique has come to be known as the step-and-repeat method.

A conventional pattern generator produces an electron beam which, at the target, is circular and has a Gaussian intensity distribution. As the beam has a typical diameter of 0.2 micrometer it can fairly be described as a point beam.

If the pattern to be drawn at a particular area of a substrate can be divided into basic rectangular elements, as is usually the case, then the point beam is made to draw the outline of each rectangle and then to fill it in by scanning the rectangle before proceeding to the next rectangle. When the complete pattern has been drawn at that area the substrate is moved so that the same pattern can be drawn at the next area as described above.

Before the semiconductor substrate is exposed to the electron beam it is usual to perform an initial, relatively coarse alignment of the substrate. Nevertheless, it is still possible for alignment errors to be introduced during device manufacture as a result of instabilities in either the electron beam pattern generator or in the semiconductor substrate. For example, the semiconductor substrate can become distorted as a result of the various treatments to which it is subjected. To compensate for any such errors it is usual to employ a reference marker system on the substrate surface. Thus, the electron beam can be directed towards the predetermined position of a marker to derive a signal representative of the deviation between the actual position and the predetermined position of that marker. This signal can then be used either to correct the substrate movement or to add a correction factor to the electron optical system so that the next time the electron beam draws the pattern it does so at the correct location.

The reference marker may be a depression in the semiconductor substrate, for example a square of 20 micrometers × 20 micrometers. When the areas at which the pattern is to be drawn are square such a marker may be located at the four corners of each such area. Before drawing the pattern at any given area the beam is directed, in turn, towards the four reference markers at the corners of that area. The beam is scanned, for example, 8 times across each edge of the marker with the scan direction being transverse to the edge in question. By observing the back-scattered electrons the deviation between the actual position and the predetermined position of the marker can be determined. To minimize errors, similar information is gathered from each of the four markers at the corners of a particular area before the pattern is drawn at that area.

More recently there have been developments in the technology of pattern generators which allow the spot size of the electron beam to be varied. For example the paper entitled "Variable spot-shaped electron beam lithographic tool" by E. V. Weber and R. D. Moore in the Journal of Vacuum Science Technology, 16(6), November/December 1979 describes a spot-shaped beam which can be varied in size up to 4 micrometers × 4 micrometers. Other systems which have been described have an even greater range over which the spot size can be varied. Clearly, the variable spot-shaped electron beam system is ideally suited to drawing patterns in a resist coating on a semiconductor substrate, particularly when the pattern can be decomposed into basic rectangular elements. In this case the time taken to a draw a pattern at a given area can be decreased considerably. This has the important consequence that pattern generators producing variable spot-shaped electron beams can have an increased throughput as compared with their point beam counterparts.

Of course, the problem of alignment errors is still present so that the need for a compensating system has not been removed. In their paper (mentioned above) Weber and Moore describe an alignment system which involves the scanning of reference markers present at the four corners of each area of the substrate where a pattern is to be drawn. The resulting back-scattered electron signals can then be processed to determine position errors at the four corners of each area.

Although the scanning of reference markers, as previously described in relation to the point beam pattern generator, is effective in determining position errors of markers it is a relatively slow technique which, when used in conjunction with the variable spot-shaped electron beam pattern generator, inevitably erodes the advantage resulting from the reduced exposure time.

According to the present invention there is provided a method of using an electron beam to effect sequentially a process at two adjacent surface areas of a target, a reference marker being provided between the areas, which method, after effecting the process at one of the areas, includes the steps of directing an electron beam having substantially the same size and shape as the marker towards the predetermined position of the marker, detecting the resulting backscattered electrons using a detector to provide a signal representative of any deviation between the actual position and the predetermined position of the marker, and responding to the signal by compensating for any such deviation when effecting the process at the second of the areas.

By using an electron beam whose size and shape is substantially the same as the reference marker, the beam current can be considerably higher than that of a point beam. This has the advantage that the number of back-scattered electrons can be significantly higher so that the detection of position errors can be carried out more quickly.

The reference marker may have a different topology to the surrounding area of the target and/or it may be constituted by an area of material having a different back-scattering coefficient to the material to the target. For example, when the target is a silicon substrate coated with an electron-sensitive resist the reference marker may be an island of silicon oxide or of a metal such as tantalum formed directly on the substrate surface. Alternatively, the reference marker may be a depression at the surface of the target formed, for example, by etching with an appropriate chemical. Of course, the reference marker may have any geometric shape, but matching the shape of the electron beam to the reference marker is particularly straightforward when the reference marker is square.

The provision of a plurality of similar reference markers between the two areas of the target is particularly advantageous not only because the effects due to the presence of a poorly-defined reference marker can then be minimized, but also because the signal-to-noise ratio of the detected signal can be increased for improved accuracy and greater speed.

Thus in one form of a method in accordance with the invention an array of similar reference markers is provided between the two surface areas of the target. After effecting the process at one of the areas and before effecting the process at the other area the method includes the step of directing the electron beam toward the predetermined position of each of the reference markers in turn.

The signals obtained by directing the electron beam toward each of the reference markers can be integrated to give an average value for the deviation between the predetermined position and the actual position of a reference marker.

In order to determine the extent and the direction of any such deviation it is preferable that the back-scattered electrons are detected using two pairs of detectors arranged such that the detectors of at least one pair provide different signals when the predetermined position of the marker deviates from the actual position. Thus the differential signal from a detector pair represents the extent of the deviation in the direction parallel to the line joining the two detectors of that pair.

In a modified form of a method in accordance with the invention an array of similar reference markers is again provided between the two surface areas of the target. In this method, however, after effecting the process at the one area and before effecting the process at the second area, the electron beam is directed towards the area of each reference marker in turn such that the beam is directed towards the predetermined position of one reference marker only. As explained in more detail hereinafter, this method allows accurate determination of position errors using only a single detector.

The array of reference markers mentioned above may be an irregular array, but the detection of alignment errors is particularly straightforward when the markers are arranged in a regular manner, for example in a single row or in a plurality of rows and columns.

Figure 2:
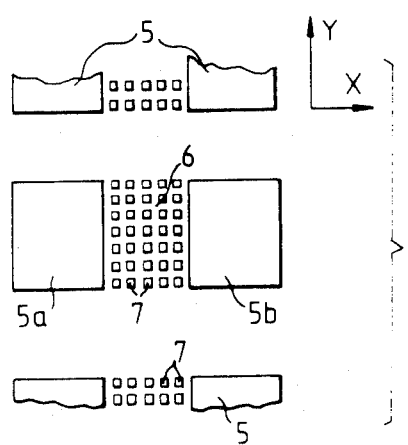
Figure 4:
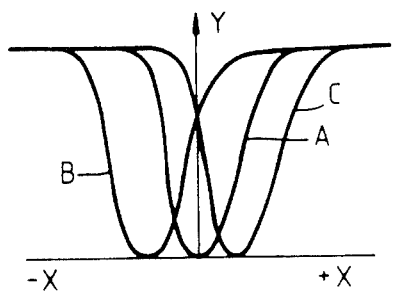

Embodiments of the invention will now be described, by way of example, with reference to the accompanying drawings, in which FIG. 1 is a diagrammatic cross-sectional view of a semiconductor wafer which is subjected to a method of using an electron beam in accordance with the invention, FIG. 2 is a plan view of part of the semiconductor wafer of FIG. 1, FIGS. 3a to 3c, are cross-sectional views of different forms of reference marker which can be provided in the semiconductor wafer, and FIG. 4 is a graph showing various plots of the intensity of back-scattered electrons from an array of reference markers using a different method in accordance with the invention.

It should be noted that, for the sake of clarity, the Figures are not drawn to scale.

In FIG. 1 a semiconductor wafer 1 is located on a movable table 2 of a variable spot-shaped electron beam pattern generator. The wafer 1 is coated on the major surface directed awy from table 2 with a layer 3 of electron sensitive resist. The wafer 1, which is generally circular, may have a diameter of approximately 4 inches and it is divided into areas 3 millimeters square where a process is to be effected sequentially using the electron beam 4. For example, at each such area an integrated circuit may be formed in conventional manner. For the sake of clarity these areas are not shown in FIG. 1. However, FIG. 2 shows several such areas 5 on a greatly distorted scale. The spacing between adjacent areas 5 may be for example 100 micrometers. None of the circuit elements of the integrated circuits is formed in the space between adjacent areas, because this represents the so-called scribe lane where the semiconductor wafer 1 will later be severed to divide it into individual integrated circuits.

In the vertical direction, between adjacent areas 5, there is provided a two-dimensional regular array 6 of similar reference markers 7 in the form of depressions at the surface of the wafer 1. For the sake of clarity FIG. 1 only shows one such array, whereas FIG. 2 (again for the sake of clarity) shows an array of 35 markers only.

The markers may, in fact, be squares of 3 micrometers spaced apart by 6 micrometers. Therefore, for a scribe lane 100 micrometers wide and 3 millimeters long the array will comprise 10 columns of 300 markers.

Figure 3A:
Figure 3B:
Figure 3C:
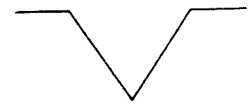

These reference markers 7 may be formed by chemically etching the silicon wafer in known manner. Depending on the way in which the etching is performed the depressions may have vertical sides as shown in FIG. 3a, sloping sides and a horizontal bottom as shown in FIG. 3b, or four sloping sides which meet at a point, as shown in FIG. 3c. Typically these depressions may be 1 micrometer deep.

In the electron beam pattern generator the variable spot-shaped beam is used to selectively expose one of the areas 5 of the wafer 1 which is coated with resist. This process is carried out to define in the resist a pattern so that selective removal of the unexposed (or, as the case may be, the exposed) parts of the resist 3 leave a masking layer for use in subsequent processing of the semiconductor wafer in the manufacture of integrated circuits. After having exposed one such area 5a the table 2 is moved to introduce an adjacent area 5b into the deflection field of the electron beam. The table is adapted to move in directions parallel and orthogonal to the scribe lanes in which the reference markers 7 are provided.

In between effecting the process at the areas 5a and 5b, that is to say after exposing area 5a and before exposing area 5b it is arranged that the electron beam has a square shape with sides of 3 micrometers. This beam, having the same size and shape as the markers 7 is directed towards the predetermined position of each of the markers 7 in turn. For this purpose the beam is stepped, relative to the wafer 1, from marker to marker by an amount equivalent to the spacing of the markers. Each time the beam is directed towards a marker the back-scattered electrons are detected using four detectors 9, two in the X-directon and two in the Y-direction. Each detector 9 of a pair is equally spaced from the marker so that a differential signal is set up across the detectors of a pair if the predetermined position of a marker deviates from its actual position. As shown schematically in FIG. 1 the detectors 9 are connected to a differential amplifier D. FIG. 1 shows two detectors only, the other two detectors being provided in the direction orthogonal to the plane of the paper.

The differential signal obtained from the differential amplifier D is representative of both the extent and the direction of any deviation between the predetermined position and the actual position of the reference marker 7 in question.

By stepping the beam from marker to marker similar information is gained at each site. Thus this information can be fed into an integrator I to give an average value, represented by the output signal 0, for the deviation between the predetermined position and the actual position of a reference marker.

The output signal 0 can be used in compensating for any such deviation when effecting the electron beam exposure process at the next area 5b. Consequently, the next time the electron beam draws a pattern it does so at the correct location. This may be achieved by adding a correction factor to either the table movement or to the electron optical system.

By using this method account can be taken of any alignment errors such as distortions which occur in the wafer 1 during processing, and the appropriate correction can be made when exposing the electron-sensitive resist to the electron beam.

By using a variable spot-shaped beam position errors can be detected very quickly, so much that the table can be moving between subsequent processing treatments while the alignment error detection is taking place simultaneously. Thus, the throughput of semiconductor wafers in the pattern generator can be significantly increased.

In a modified form of a method in accordance with the invention the same two dimensional array 6 of similar reference markers 7 can be provided between adjacent areas 6 of a semiconductor wafer 1 as described above with reference to FIG. 1. After effecting the electron beam process at one such area and before moving the semiconductor wafer in order to effect the same process at the adjacent area the electron beam is directed towards the area of each reference marker in turn, but the beam is stepped, relative to the wafer 1, from the area of one marker to the area of an adjacent marker by an amount which is either more or less but not the same as the spacing of adjacent reference markers. Thus in this case, for example the beam may be stepped by 6.05 micrometers. Again the beam has the same size and shape as the individual reference markers 7, that is to say it is 3 micrometers square, but in contrast with the previous method the beam is directed towards the predetermined position of the reference marker at the center of the array only. As such, assuming that there are no alignment errors, the beam will be coincident with one reference marker only, viz. the marker at the center of the array, and it will be misaligned with all the other markers. This enables a single detector to be used in determining position errors of the reference markers, the signals from al the markers being utilized in determining any such errors. FIG. 4 shows three plots of the signals obtained under different circumstances. Plot A represents no deviation between the predetermined position and the actual position of the central reference marker. Plot B represents the situation where the beam has been aligned with a reference marker in the negative X-direction and Plot C represents the situation where the beam has been aligned with a reference marker in the positive X-direction. Similar information for the Y-direction can of course be obtained by plotting the signal intensity for the reference markers in the Y-direction. This information indicates the extent of any correction which may be needed to ensure that the electron beam is correctly aligned when effecting the electron beam process at subsequent areas. As before the correction factor may be applied to the movement of the table on which the semiconductor wafer is mounted or to the electron optical system.

The embodiments described here are given merely by way of example. In the light of the above description it will be clear to the person skilled in the art that many modifications are possible within the scope of the invention.

We claim:

1. In a method of using an electron beam to sequentially carry out a process at least at two adjacent surface areas of a target having at least one reference marker provided between said two adjacent surface areas, said method comprising the steps of carrying out said process at one of said two adjacent surface areas, thereafter directing an electron beam having the same size and shape as said reference marker toward a predetermined position of said reference marker, detecting back-scattered electrons from the area of said reference marker by a detection device, said detection device providing signals representative of deviations between the actual position and said predetermined position of said reference marker, and compensating for any said deviations before carrying out said process at another of said two adjacent surface areas.

2. A method according to claim 1, wherein said reference marker is provided as a depression in a surface of said target.

3. A method according to claim 2, wherein said reference marker is square.

4. A method according to claim 3, wherein said depression is provided by chemically etching said surface of said target.

5. A method according to claim 1, wherein said detection device includes two pairs of detectors arranged so that at least one pair of detectors provides differential signals when said predetermined position deviates from said actual position, said differential signals representing an extent of deviation in a direction parallel to a line between said pair of detectors.

6. A method according to claim 1, wherein an array of similar reference markers is provided between said two adjacent surface areas, and wherein said electron beam is directed to each reference marker in turn.

7. A method according to claim 6, wherein said signals obtained from said array of reference marks are integrated to provide an average value for said deviations.

8. A method according to claim 6, wherein said reference marker is provided as a depression in a surface of said target.

9. A method according to claim 6, wherein said reference marker is square.

10. A method according to claim 6, wherein said depression is provided by chemically etching said surface of said target.

11. A method according to claim 6, wherein said detection device includes two pairs of detectors arranged so that at least one pair of detectors provides differential signals when said predetermined position deviates from said actual position, said differential signals representing an extent of deviation in a direction parallel to a line between said pair of detectors.

12. A method according to claim 6, wherein said array includes at least a single row of said reference markers or a plurality of rows and columns of said reference markers.

13. A method according to claim 1, wherein an array of similar reference markers is provided between said two adjacent surface areas, and wherein said electron beam is directed only toward said predetermined position of one reference marker upon directing said electron beam toward each reference marker in turn.

14. A method according to claim 13, wherein said reference marker is provided as a depression in a surface of said target.

15. A method according to claim 13, wherein said reference marker is square.

16. A method according to claim 13, wherein said depression is provided by chemically etching said surface of said target.

17. A method according to claim 13, wherein said detection device is a single detector.

18. A method according to claim 13, wherein said array includes at least a single row of said reference markers or a plurality of rows and columns of said reference markers.

19. A method according to claim 1, wherein said reference marker is square.

20. A method according to claim 1, wherein said depression is provided by chemically etching said surface of said target.

21. A method according to claim 1, wherein said reference marker is an island of silicon oxide or a metal such as tantalum.

* * * * *